(12) United States Patent
Ligon

(10) Patent No.: US 7,859,026 B2
(45) Date of Patent: Dec. 28, 2010

(54) VERTICAL SEMICONDUCTOR DEVICE

(75) Inventor: William A. Ligon, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 380 days.

(21) Appl. No.: 11/378,463

(22) Filed: Mar. 16, 2006

(65) Prior Publication Data

US 2007/0215940 A1    Sep. 20, 2007

(51) Int. Cl.
*H01L 29/76* (2006.01)

(52) U.S. Cl. .............. 257/213; 257/302; 257/E27.096; 257/E29.186; 257/E29.262; 257/E29.274; 257/E21.375; 257/E21.41; 257/E21.447; 257/E21.629; 257/E21.643; 438/294; 438/295; 438/296; 438/390; 438/391; 438/392; 438/246; 438/444; 438/427

(58) Field of Classification Search .......... 257/213, 257/302, E27.096, E29.186, E29.262, 26.274, 257/E21.375, E21.41, E21.447, E21.629, 257/E21.643, E21.652, 314–326, 295, 323, 257/E29

See application file for complete search history.

(56) References Cited

U.S. PATENT DOCUMENTS

| | | | | |
|---|---|---|---|---|
| 4,728,619 A | * | 3/1988 | Pfiester et al. | 438/451 |
| 4,786,953 A | * | 11/1988 | Morie et al. | 257/331 |
| 4,878,102 A | * | 10/1989 | Bakker et al. | 257/215 |
| 4,931,409 A | * | 6/1990 | Nakajima et al. | 438/430 |
| 5,021,359 A | * | 6/1991 | Young et al. | 438/154 |
| 5,045,489 A | * | 9/1991 | Gill et al. | 438/258 |
| 5,135,879 A | * | 8/1992 | Richardson | 438/259 |
| 5,168,334 A | * | 12/1992 | Mitchell et al. | 257/324 |
| 5,177,576 A | * | 1/1993 | Kimura et al. | 257/71 |
| 5,210,046 A | * | 5/1993 | Crotti | 438/453 |
| 5,266,526 A | * | 11/1993 | Aoyama et al. | 438/642 |
| 5,293,061 A | * | 3/1994 | Hosaka | 257/622 |
| 5,298,775 A | * | 3/1994 | Ohya | 257/211 |
| 5,327,374 A | * | 7/1994 | Krautschneider et al. | 365/149 |
| 5,338,953 A | * | 8/1994 | Wake | 257/316 |
| 5,411,905 A | | 5/1995 | Acovic et al. | |
| 5,432,739 A | * | 7/1995 | Pein | 365/185.11 |
| 5,469,383 A | * | 11/1995 | McElroy et al. | 365/185.01 |

(Continued)

FOREIGN PATENT DOCUMENTS

DE    19840984 A1    11/1999

(Continued)

OTHER PUBLICATIONS

PCT Search Report for PCT/US07/06715, Aug. 28, 2007, Spansion LLC.

(Continued)

*Primary Examiner*—Fernando L Toledo
*Assistant Examiner*—Ankush K Singal

(57) ABSTRACT

A semiconductor device and methods for its fabrication are provided. The semiconductor device comprises a trench formed in the semiconductor substrate and bounded by a trench wall extending from the semiconductor surface to a trench bottom. A drain region and a source region, spaced apart along the length of the trench, are formed along the trench wall, each extending from the surface toward the bottom. A channel region is formed in the substrate along the trench wall between the drain region and the source region and extending along the length of the trench parallel to the substrate surface. A gate insulator and a gate electrode are formed overlying the channel.

11 Claims, 8 Drawing Sheets

U.S. PATENT DOCUMENTS

| | | | | |
|---|---|---|---|---|
| 5,491,356 | A * | 2/1996 | Dennison et al. | 257/306 |
| 5,508,544 | A * | 4/1996 | Shah | 257/316 |
| 5,559,357 | A * | 9/1996 | Krivokapic | 257/336 |
| 5,627,097 | A * | 5/1997 | Venkatesan et al. | 438/217 |
| 5,629,226 | A * | 5/1997 | Ohtsuki | 438/389 |
| 5,637,896 | A * | 6/1997 | Huang | 257/316 |
| 5,686,344 | A * | 11/1997 | Lee | 438/425 |
| 5,696,008 | A * | 12/1997 | Tamaki et al. | 438/212 |
| 5,705,409 | A * | 1/1998 | Witek | 438/212 |
| 5,705,415 | A * | 1/1998 | Orlowski et al. | 438/259 |
| 5,741,716 | A * | 4/1998 | Choi et al. | 438/158 |
| 5,789,306 | A * | 8/1998 | Roberts et al. | 438/452 |
| 5,804,854 | A * | 9/1998 | Jung et al. | 257/321 |
| 5,834,359 | A * | 11/1998 | Jeng et al. | 438/425 |
| 5,854,500 | A * | 12/1998 | Krautschneider | 257/300 |
| 5,861,330 | A * | 1/1999 | Baker et al. | 438/232 |
| 5,872,037 | A * | 2/1999 | Iwamatsu et al. | 438/268 |
| 5,909,630 | A * | 6/1999 | Roberts et al. | 438/452 |
| 5,981,995 | A * | 11/1999 | Selcuk | 257/330 |
| 5,998,261 | A * | 12/1999 | Hofmann et al. | 438/257 |
| 5,998,263 | A * | 12/1999 | Sekariapuram et al. | 438/259 |
| 6,002,149 | A * | 12/1999 | Dennison et al. | 257/309 |
| 6,008,516 | A * | 12/1999 | Mehrad et al. | 257/315 |
| 6,015,725 | A * | 1/2000 | Hirayama | 438/156 |
| 6,040,210 | A * | 3/2000 | Burns et al. | 438/238 |
| 6,077,745 | A * | 6/2000 | Burns et al. | 438/270 |
| 6,097,065 | A * | 8/2000 | Forbes et al. | 257/315 |
| 6,097,621 | A * | 8/2000 | Mori | 365/63 |
| 6,124,608 | A * | 9/2000 | Liu et al. | 257/315 |
| 6,133,098 | A * | 10/2000 | Ogura et al. | 438/267 |
| 6,137,134 | A * | 10/2000 | Nakagawa | 257/316 |
| 6,141,236 | A * | 10/2000 | Kengeri | 365/63 |
| 6,143,608 | A * | 11/2000 | He et al. | 438/264 |
| 6,144,062 | A * | 11/2000 | Mine et al. | 257/317 |
| 6,144,086 | A * | 11/2000 | Brown et al. | 257/510 |
| 6,166,941 | A * | 12/2000 | Yoshida et al. | 365/63 |
| 6,211,014 | B1 * | 4/2001 | Hsu | 438/259 |
| 6,243,293 | B1 * | 6/2001 | Van Houdt et al. | 365/185.14 |
| 6,246,083 | B1 * | 6/2001 | Noble | 257/296 |
| 6,248,645 | B1 * | 6/2001 | Matsuoka et al. | 438/424 |
| 6,303,439 | B1 * | 10/2001 | Lee et al. | 438/259 |
| 6,312,986 | B1 * | 11/2001 | Hermes | 438/254 |
| 6,320,222 | B1 * | 11/2001 | Forbes et al. | 257/331 |
| 6,335,237 | B1 * | 1/2002 | Tang et al. | 438/238 |
| 6,391,726 | B1 * | 5/2002 | Manning | 438/286 |
| 6,437,397 | B1 * | 8/2002 | Lin et al. | 257/321 |
| 6,458,677 | B1 * | 10/2002 | Hopper et al. | 438/591 |
| 6,492,675 | B1 * | 12/2002 | Van Buskirk et al. | 257/314 |
| 6,504,200 | B2 * | 1/2003 | Schlosser et al. | 257/301 |
| 6,518,628 | B1 * | 2/2003 | Krautschneider et al. | 257/372 |
| 6,559,491 | B2 * | 5/2003 | Forbes et al. | 257/296 |
| 6,566,187 | B1 * | 5/2003 | Willer et al. | 438/239 |
| 6,566,202 | B2 * | 5/2003 | Goebel et al. | 438/270 |
| 6,610,575 | B1 * | 8/2003 | Ang et al. | 438/275 |
| 6,639,268 | B2 * | 10/2003 | Forbes et al. | 257/315 |
| 6,642,569 | B2 * | 11/2003 | Mori et al. | 257/314 |
| 6,649,467 | B2 * | 11/2003 | Clampitt et al. | 438/241 |
| 6,680,501 | B2 * | 1/2004 | Ito et al. | 257/296 |
| 6,700,150 | B1 * | 3/2004 | Wu | 257/296 |
| 6,730,961 | B2 * | 5/2004 | Kitamura | 257/330 |
| 6,734,058 | B2 * | 5/2004 | Park | 438/242 |
| 6,740,954 | B2 * | 5/2004 | Lee | 257/499 |
| 6,747,313 | B1 * | 6/2004 | Gil | 257/329 |
| 6,765,257 | B1 * | 7/2004 | Mehrad et al. | 257/314 |
| 6,800,526 | B2 * | 10/2004 | Lin et al. | 438/267 |
| 6,806,137 | B2 * | 10/2004 | Tran et al. | 438/239 |
| 6,806,532 | B2 * | 10/2004 | Kobayashi | 257/324 |
| 6,831,310 | B1 * | 12/2004 | Mathew et al. | 257/270 |
| 6,841,452 | B2 * | 1/2005 | Tanaka | 438/424 |
| 6,844,239 | B2 * | 1/2005 | Lee | 438/433 |
| 6,864,523 | B2 * | 3/2005 | Chen | 257/296 |
| 6,878,991 | B1 * | 4/2005 | Forbes | 257/328 |
| 6,882,572 | B2 * | 4/2005 | Wang et al. | 365/185.18 |
| 6,894,354 | B2 * | 5/2005 | Jono et al. | 257/374 |
| 6,900,521 | B2 * | 5/2005 | Forbes et al. | 257/616 |
| 6,964,903 | B2 * | 11/2005 | Forbes et al. | 438/283 |
| 6,982,458 | B2 * | 1/2006 | Chu et al. | 257/316 |
| 7,030,439 | B2 * | 4/2006 | Yun et al. | 257/296 |
| 7,037,782 | B2 * | 5/2006 | Miida | 438/257 |
| 7,118,988 | B2 * | 10/2006 | Buerger et al. | 438/437 |
| 7,118,998 | B1 * | 10/2006 | Dark et al. | 438/542 |
| 7,120,046 | B1 * | 10/2006 | Forbes | 365/149 |
| 7,176,518 | B2 * | 2/2007 | Jung | 257/315 |
| 7,273,784 | B2 * | 9/2007 | Bhattacharyya | 438/259 |
| 7,300,848 | B2 * | 11/2007 | Jang | 438/302 |
| 7,323,726 | B1 * | 1/2008 | Chang et al. | 257/202 |
| 7,332,779 | B2 * | 2/2008 | Chang | 257/365 |
| 7,371,627 | B1 * | 5/2008 | Forbes | 438/197 |
| 7,411,246 | B2 * | 8/2008 | Kianian | 257/321 |
| 7,432,122 | B2 * | 10/2008 | Mathew et al. | 438/48 |
| 7,518,182 | B2 * | 4/2009 | Abbott et al. | 257/329 |
| 7,601,595 | B2 * | 10/2009 | Forbes | 438/268 |
| 7,626,219 | B2 * | 12/2009 | Forbes | 257/266 |
| 2002/0031887 | A1 * | 3/2002 | Harshfield | 438/257 |
| 2002/0048875 | A1 * | 4/2002 | Manning | 438/213 |
| 2002/0121673 | A1 * | 9/2002 | Jono et al. | 257/510 |
| 2002/0158273 | A1 * | 10/2002 | Satoh et al. | 257/211 |
| 2004/0007721 | A1 * | 1/2004 | Forbes et al. | 257/204 |
| 2004/0026737 | A1 * | 2/2004 | Zundel et al. | 257/330 |
| 2004/0104418 | A1 * | 6/2004 | Kowalski et al. | 257/302 |
| 2004/0121540 | A1 * | 6/2004 | Lin | 438/257 |
| 2004/0135190 | A1 * | 7/2004 | Lindstedt et al. | 257/314 |
| 2004/0232472 | A1 * | 11/2004 | Sakui et al. | 257/314 |
| 2004/0251485 | A1 * | 12/2004 | Kito et al. | 257/301 |
| 2005/0045940 | A1 * | 3/2005 | Chen et al. | 257/315 |
| 2005/0062096 | A1 * | 3/2005 | Sasago et al. | 257/321 |
| 2005/0098824 | A1 * | 5/2005 | Chen | 257/315 |
| 2005/0104115 | A1 * | 5/2005 | Kianian | 257/314 |
| 2005/0133861 | A1 * | 6/2005 | Mizokuchi et al. | 257/330 |
| 2005/0136592 | A1 * | 6/2005 | Choi | 438/257 |
| 2005/0136631 | A1 * | 6/2005 | Jaiprakash et al. | 438/589 |
| 2005/0156243 | A1 * | 7/2005 | Manning | 257/347 |
| 2005/0162884 | A1 * | 7/2005 | Jung | 365/63 |
| 2005/0173748 | A1 * | 8/2005 | Seitz et al. | 257/301 |
| 2005/0269626 | A1 * | 12/2005 | Forbes | 257/315 |
| 2006/0006383 | A1 * | 1/2006 | Hovel et al. | 257/48 |
| 2006/0017088 | A1 * | 1/2006 | Abbott et al. | 257/302 |
| 2006/0261436 | A1 * | 11/2006 | Turner et al. | 257/506 |
| 2006/0284225 | A1 * | 12/2006 | Popp et al. | 257/296 |
| 2007/0018206 | A1 * | 1/2007 | Forbes | 257/288 |
| 2007/0122971 | A1 * | 5/2007 | Dobuzinsky et al. | 438/257 |
| 2007/0252195 | A1 * | 11/2007 | Yoshikawa et al. | 257/329 |
| 2008/0157192 | A1 * | 7/2008 | Pang | 257/334 |

FOREIGN PATENT DOCUMENTS

| | | |
|---|---|---|
| JP | 07045797 A | 2/1995 |
| WO | WO 03/096425 A | 11/2003 |

OTHER PUBLICATIONS

PCT Written Opinion for PCT/US07/06715, Aug. 28, 2007, Spansion LLC.

\* cited by examiner

VERTICAL SEMICONDUCTOR DEVICE

TECHNICAL FIELD OF THE INVENTION

The present invention generally relates to a vertical semiconductor device, and more particularly relates to a vertical MOS device fabricated in the wall of a trench formed in a semiconductor substrate and having a channel along the edge of the trench parallel to the surface of the semiconductor substrate.

BACKGROUND OF THE INVENTION

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain regions between which a current can flow. A control voltage applied to the gate electrode controls the flow of current through a channel between the source and drain electrodes.

ICs are typically fabricated in and on a thin semiconductor substrate having a substantially planar surface. The source and drain regions are spaced apart impurity doped regions ion implanted into the substantially planar surface on opposite sides of the gate electrode which is formed overlying the planar surface. As the complexity of the integrated circuits increases, more and more MOS transistors are needed to implement the integrated circuit function. As more and more transistors are designed into the IC, it becomes important to shrink the size of individual MOS transistors so that the size of the IC remains reasonable and the IC can be reliably manufactured. Shrinking the size of an MOS transistor implies that the minimum feature size, that is, the minimum width of a line or the minimum spacing between lines, is reduced. MOS transistors have now been aggressively reduced to the point at which the gate electrode of the transistor is less than or equal to 90 nanometers (nm) in width. Aggressively shrinking the minimum feature size even further to incorporate more devices in and on the planar substrate surface, however, will incur a significant increase in manufacturing cost, in terms of increased capital expenditures and reduced yield.

Attempts have been made to overcome the problem of packing more and more transistors onto the semiconductor surface by manufacturing vertical transistors. In such attempts, instead of locating each of the source, drain, and channel on the substantially planar surface of the substrate, the vertical transistors are fabricated in trenches that are etched into the surface of the substrate with a source at the bottom of the trench, a drain at the top of the trench near the semiconductor surface, and a channel conducting current along the wall of the trench between the source and the drain. Unfortunately, such attempts have been largely unsuccessful because of problems of isolating one transistor from another and of making the necessary electrical contacts to the vertical transistor elements.

Accordingly, it is desirable to provide a vertical device structure that allow an increase in the number of devices integrated in an IC without requiring a further reduction in minimum feature size. In addition, it is desirable to provide a memory IC based on a vertical transistor structure. Furthermore, other desirable features and characteristics of the present invention will become apparent from the subsequent detailed description and the appended claims, taken in conjunction with the accompanying drawings and the foregoing technical field and background.

BRIEF SUMMARY OF THE INVENTION

A vertical semiconductor device and a method for its fabrication are provided. The semiconductor device comprises a trench formed in the semiconductor substrate and bounded by a trench wall extending from the semiconductor surface to a trench bottom. A drain region and a source region, spaced apart along the length of the trench, are formed along the trench wall, each extending from the surface toward the bottom. A channel region is formed in the substrate along the trench wall between the drain region and the source region and extending along the length of the trench parallel to the substrate surface. A gate insulator and a gate electrode are formed overlying the channel.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
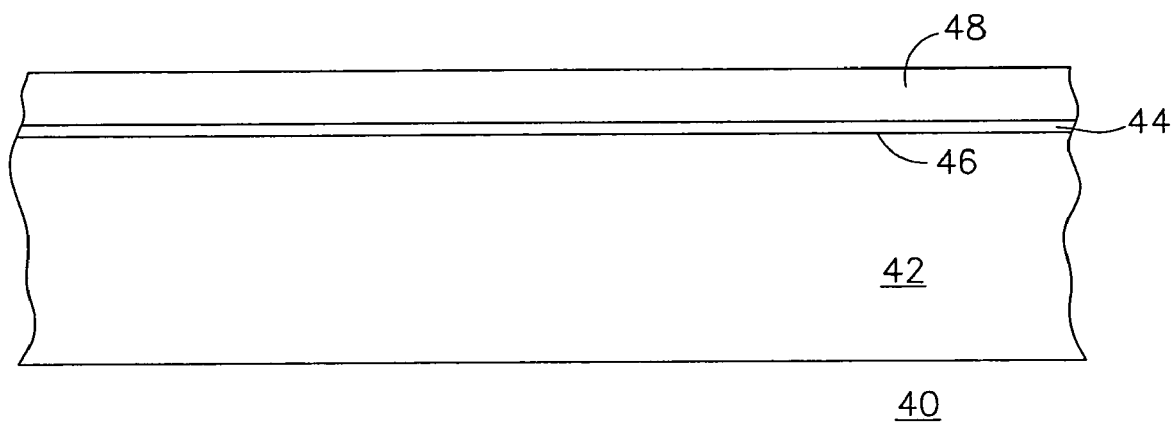
FIG. 1-13 illustrate a portion of a semiconductor device and method steps for its fabrication in accordance with various embodiments of the invention.

The following detailed description is merely exemplary in nature and is not intended to limit the invention or the application and uses of the invention. Furthermore, there is no intention to be bound by any expressed or implied theory presented in the preceding technical field, background, brief summary or the following detailed description. Terms such as "vertical" and "horizontal" are used herein for descriptive purposes and refer only to orientation with respect to the surface of a substrate (taken to be horizontal), and are not intended to otherwise limit the orientation of the inventive device.

FIGS. 1-13 schematically illustrate a semiconductor memory integrated circuit 40 and method steps for the fabrication of integrated circuit 40 in accordance with various embodiments of the invention. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. In these illustrative embodiments only a small portion of integrated circuit 40 is illustrated. Various steps in the manufacture of MOS devices are well known and so, in the interest of brevity, many conventional steps will only be mentioned briefly herein or will be omitted entirely without providing the well known process details. In this exemplary embodiment integrated circuit 40 is illustrated to be a non-volatile memory circuit such as an electrically erasable programmable read only memory (EEPROM) or a Flash memory, but the invention is also applicable to other semiconductor memory circuits as well as to other ICs, especially those that have a repetitive structure.

A semiconductor memory IC typically includes a memory array or core area and a peripheral area. The core area, in which data is stored, usually, but not necessarily, includes only N-channel MOS (NMOS) transistors and the exemplary embodiment described below will be such an NMOS circuit.

The invention is not limited, however, to such single channel embodiments. The peripheral area, which includes support circuitry such as clock circuits, address circuits, I/O circuits, and the like, usually includes complementary MOS (CMOS) transistors. In accordance with an embodiment of the invention, the peripheral circuitry is conventional and is fabricated in substantially the conventional manner with conventional (not vertical) CMOS transistors. Because the peripheral circuitry is fabricated in conventional manner, the peripheral circuitry and the process steps for fabricating such circuitry will not be illustrated or described except to discuss how such conventional process steps are integrated process for fabricating the core area. Accordingly, the drawing figures will illustrate only (a portion of) the core area of integrated circuit 40.

As illustrated in FIG. 1, fabrication of a semiconductor device in accordance with one embodiment of the invention begins with providing a semiconductor substrate 42. Although other semiconductor materials can be used, the semiconductor substrate is preferably a silicon substrate, either a bulk substrate or a silicon on insulator (SOI) substrate. Without limitation, the semiconductor substrate will generally be referred to herein as a silicon substrate. As used herein, the term "silicon substrate" will be used to encompass the relatively pure monocrystalline silicon materials typically used in the semiconductor industry, either bulk or SOI, as well as silicon admixed with other elements such as germanium, carbon, and the like to form substantially monocrystalline semiconductor material.

In accordance with a preferred embodiment of the invention isolation in the peripheral portion of the IC, preferably shallow trench isolation (STI), is formed first. Because the peripheral isolation is formed in conventional manner, the process steps for its formation will not be described in detail and will not be illustrated in the drawing figures. Although many techniques can be used for forming STI, all such methods generally involve forming a pad oxide and a layer of nitride on the silicon substrate, patterning the nitride and oxide as an etch mask, etching trenches into the surface of the substrate, filling the trenches with an oxide or other insulator, and removing the excess oxide, for example by chemical mechanical planarization (CMP). During the formation of the peripheral isolation the core area is protected by the silicon nitride layer that is left unpatterned over the core area.

As illustrated in cross section in FIG. 1, in accordance with an embodiment of the invention, a thin layer of oxide 44 is formed on surface 46 of the silicon substrate. A layer of silicon nitride 48, having a thickness of about 90 nm is deposited over the layer of oxide. Layer of oxide 44 can be grown by heating the silicon substrate in an oxidizing ambient and layer of silicon nitride 48 can be deposited by low pressure chemical vapor deposition (LPCVD) by the reaction of dichlorosilane and ammonia.

Figure 2:
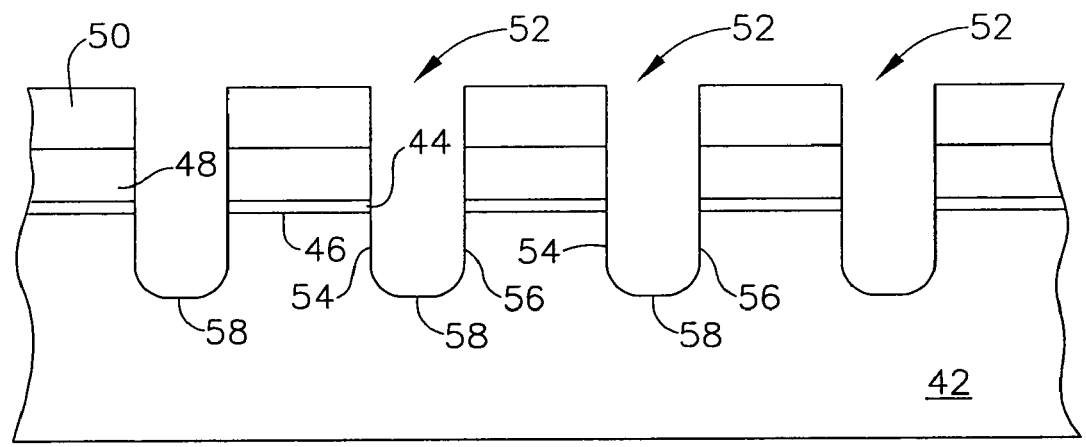

A layer of photoresist 50 is applied over silicon nitride layer 48 and is patterned as illustrated in cross section in FIG. 2. Although not illustrated, the photoresist is left unpatterned and protecting the peripheral area of the IC. Using the patterned photoresist as an etch mask, trenches 52 are etched into the surface of silicon substrate 42 in the core area. Preferably the trenches are anisotropically etched, for example by reactive ion etching (RIE) using a Cl or $HBr/O_2$ chemistry. The anisotropic etching results in trench walls 54, 56 that are nearly vertical extending from surface 46 to the trench bottom 58. Although not apparent in FIG. 2 (but illustrated in FIG. 4 below) the walls of trenches 52, when viewed along their length, preferably are not straight, but rather are patterned and etched to leave enlarged contact regions 59 in the silicon substrate bordering the trenches. Most preferably, the contact regions are staggered from row to row to increase packing density. "Row" is used here in the context of rows and columns of a memory array. Word lines will eventually be formed along the row direction. The number and length of trenches will be determined by the size of the memory to be fabricated.

Figure 3:
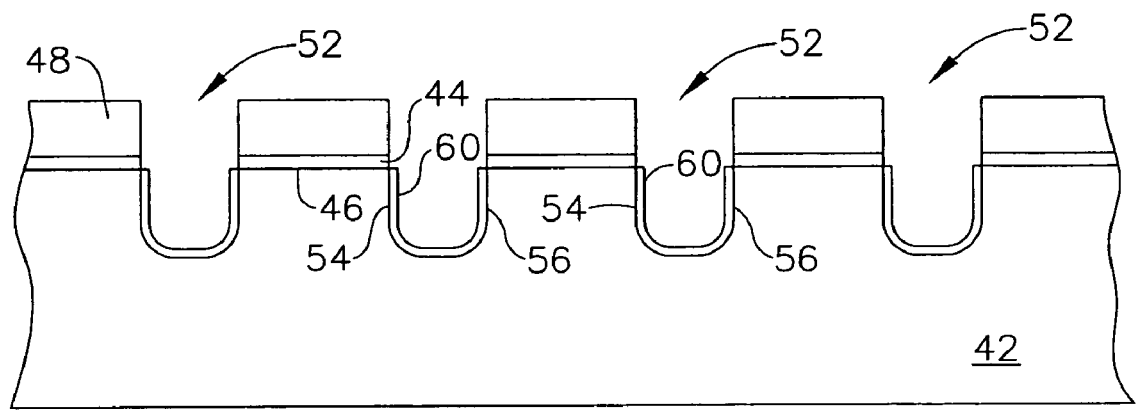
Figure 5:
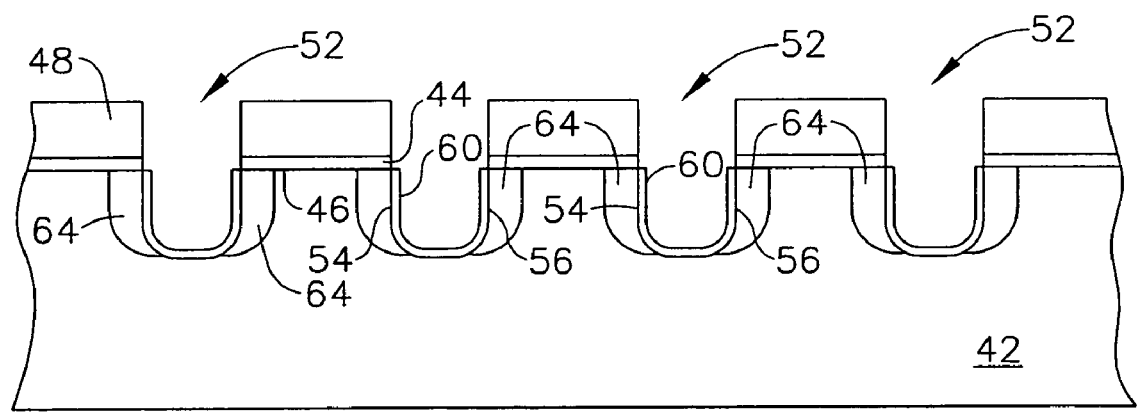
Figure 4:
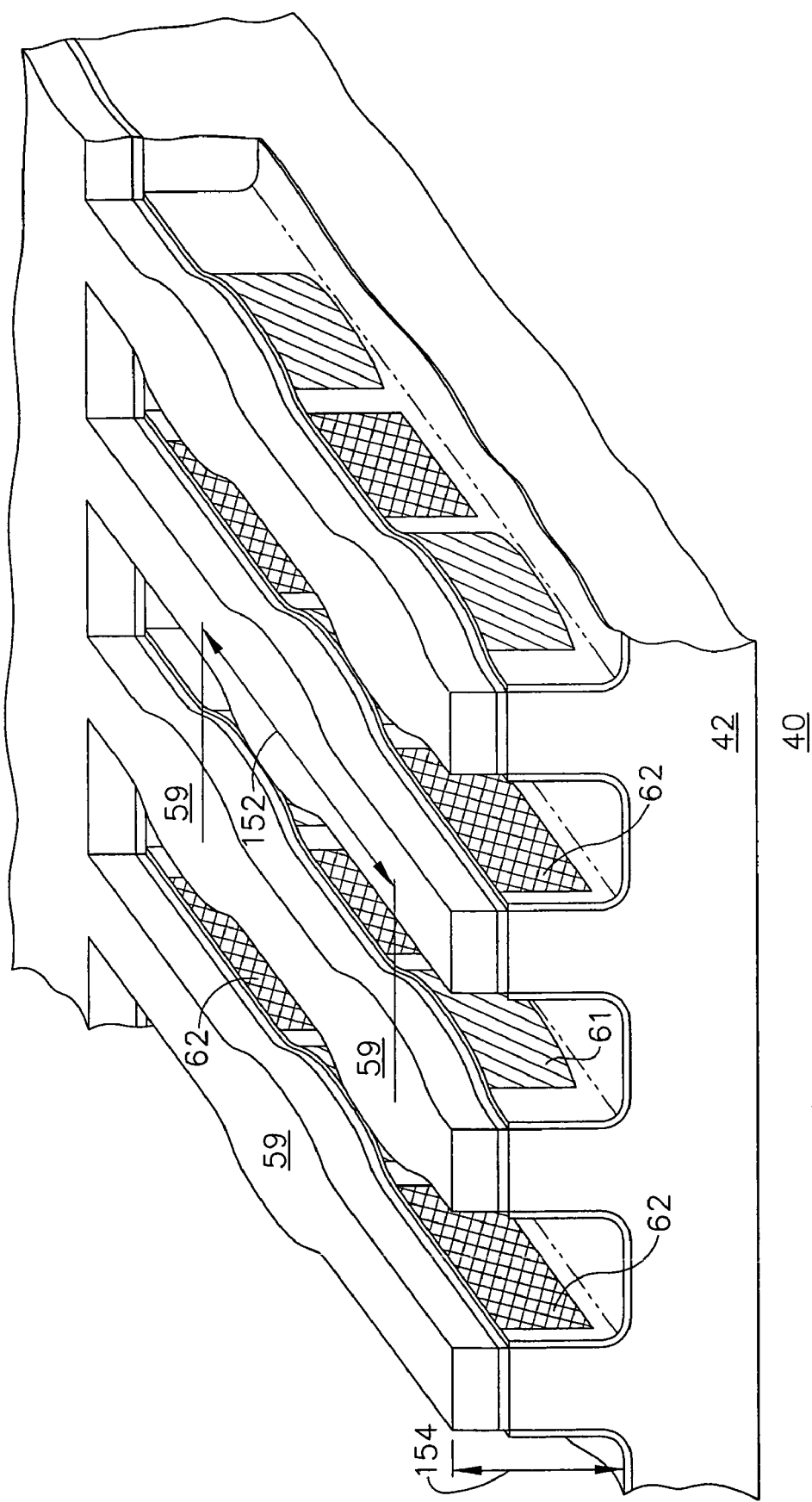

After completing the trench etch, photoresist layer 50 is stripped and a thin layer of thermal oxide 60 is grown as an oxide liner on the walls and bottom of the trenches as illustrated in cross section in FIG. 3. One or more layers of thermal oxide (not illustrated) may be grown and subsequently removed by etching before the growth of oxide 60. The growth and stripping of the additional layers of thermal oxide remove etch damage caused by the trench etching. During the growth and stripping the peripheral area is protected by nitride layer 48. Layer 60 removes additional damage caused by the trench etching and prevents implant channeling during subsequent ion implantations. FIG. 4 illustrates, in a partially cut away perspective view, a portion of IC 40 at this stage of the processing. The areas indicated by diagonal shading lines 61 are areas in which source and drain regions will be formed. The areas indicated by cross hatching 62 are areas in which the channel regions of the memory transistors will be formed. Just for clarity of understanding, double headed arrow 152 indicates the length direction of trenches 52, and double headed arrow 154 indicates the depth direction of the trenches.

In conventional CMOS processing ions are implanted into the surface of the substrate to form doped well regions in which the active transistors are formed. In accordance with an embodiment of this invention the well regions are formed in the portions of the substrate forming the walls of trenches 52. Because the core of the IC will be formed of NMOS transistors, P-type ions are implanted through thermal oxide 60 into the substrate forming the walls of the trenches to form P-doped wells 64 as illustrated in cross section in FIG. 5. Because walls 54, 56 are nearly vertical, the ions are implanted at a high tilt angle determined by the depth of the trench and the proximity of the adjacent trench. Multiple implants may be used to tailor the concentration gradient of the dopant in the wells. An additional implant (not illustrated) may also be used to adjust the threshold voltage of the MOS transistors. The implants are then activated by heating, for example by rapid thermal annealing (RTA). As illustrated, the wells are formed on both walls of the trenches so that vertical transistors can be formed in both walls, optimizing the density of transistors in a given unit of surface area.

Figure 6:
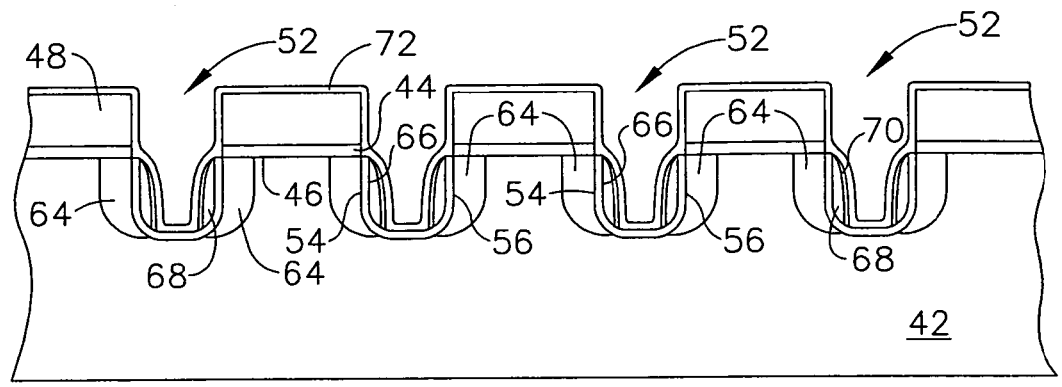

In accordance with this exemplary embodiment of the invention, specifically if the semiconductor device being fabricated is a non-volatile memory IC, thin thermal oxide 60 is stripped and a thin tunnel oxide 66 is grown on the walls and bottom of trenches 52 as illustrated in cross section in FIG. 6. Preferably tunnel oxide 66 has a thickness of about 8-9 nm. A layer of silicon, either amorphous or polycrystalline but hereinafter referred to as a poly layer, is deposited onto the layer of tunnel oxide. The poly layer is anisotropically etched, for example by RIE, to form poly spacers 68 extending from near the surface of the substrate but below the bottom of nitride layer 48 to the bottom of the trenches. The anisotropic etching removes the poly layer from the bottom of the trenches as well as from the nitride layer 48 and from the peripheral area. In forming a volatile device, the tunnel oxide would be the gate insulator of the MOS transistor and the poly spacer would form the gate electrode. Continuing the process for fabricating a non-volatile memory device, the poly spacers are thermally oxidized to form a layer of oxide 70 having a thickness of about 4-5 nm and a layer of silicon nitride 72 having a thickness of about 8-9 nm is deposited over oxide layer 70.

Figure 7:
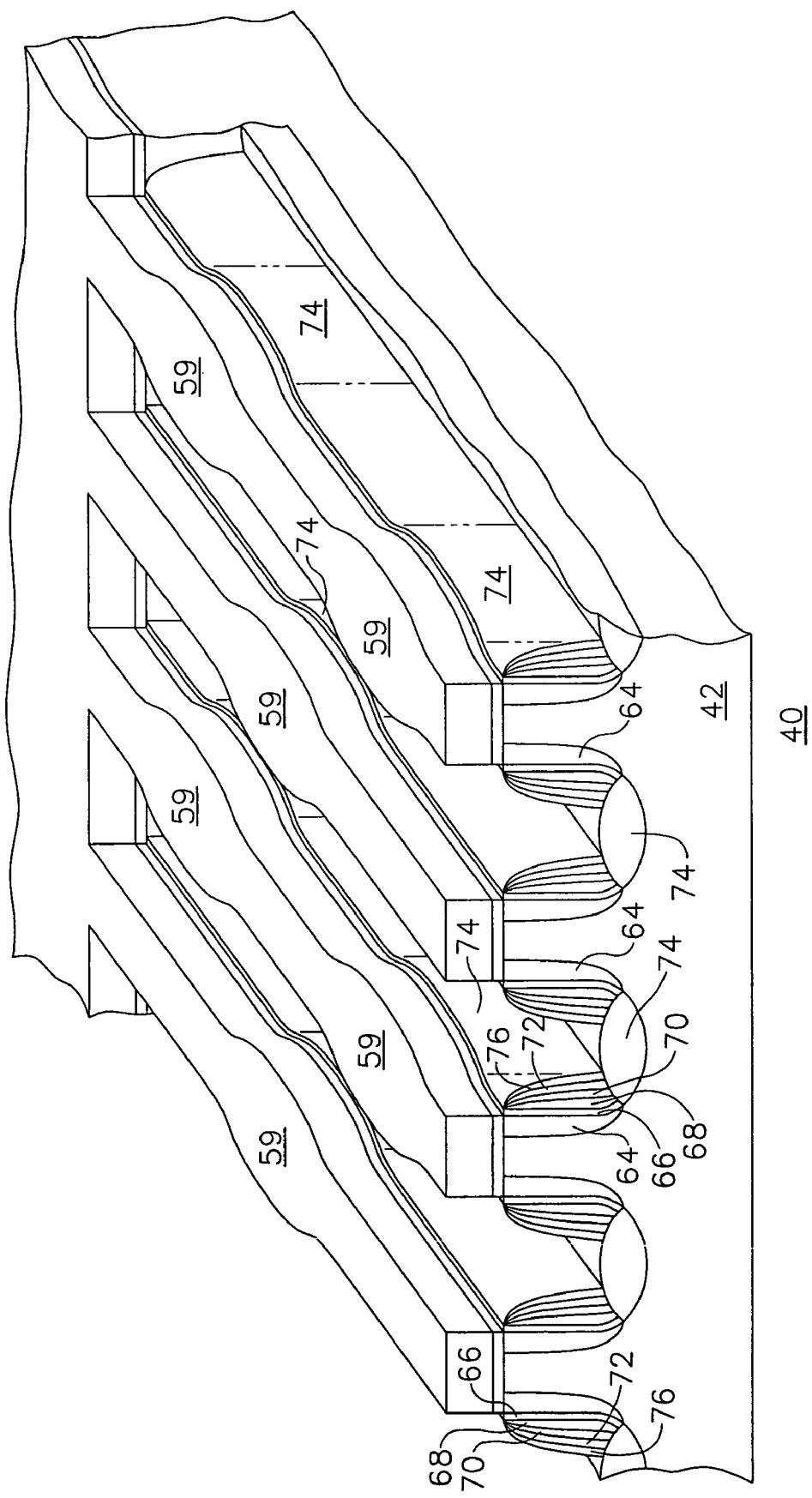

A layer of photoresist (not illustrated) is applied and patterned to leave the patterned photoresist covering the silicon nitride that is located over the channel regions of the MOS transistors as indicated by cross hatching 62 in FIG. 4. The patterned photoresist is used as an etch mask and the exposed silicon nitride and the poly layer underlying the exposed silicon nitride is etched, preferably in a high pressure isotropic plasma etch. The high pressure etch aids in removing silicon nitride from corners and otherwise difficult to etch areas. After the etch, silicon nitride layer 72 and poly spacer 68 are left covering only the channel regions. The nitride etch is controlled in length so that the bulk of silicon nitride layer 48 remains on the surface of the substrate. Patterned silicon nitride layer 72 and silicon nitride layer 48 are together used as an oxidation mask and a thick thermal isolation oxide 74 is grown on the exposed silicon by heating in an oxidizing ambient. The exposed silicon is the silicon at the bottom 58 of trenches 52 as well as on the walls 54, 56 of the trench in the areas indicated in FIG. 4 by diagonal shading lines 61. The isolation oxide is grown as a LOCOS oxide. The thermal oxidation process also grows a thin thermal oxide 76 on the surface of patterned silicon nitride layer 72. Thermal oxide 76, together with patterned silicon nitride layer 72 and oxide layer 70 form an oxide-nitride-oxide (ONO) memory film or memory stack on poly layer 68. FIG. 7 illustrates, in a partially cut away perspective view, a portion of integrated circuit 40 at this stage of the processing.

Figure 8:
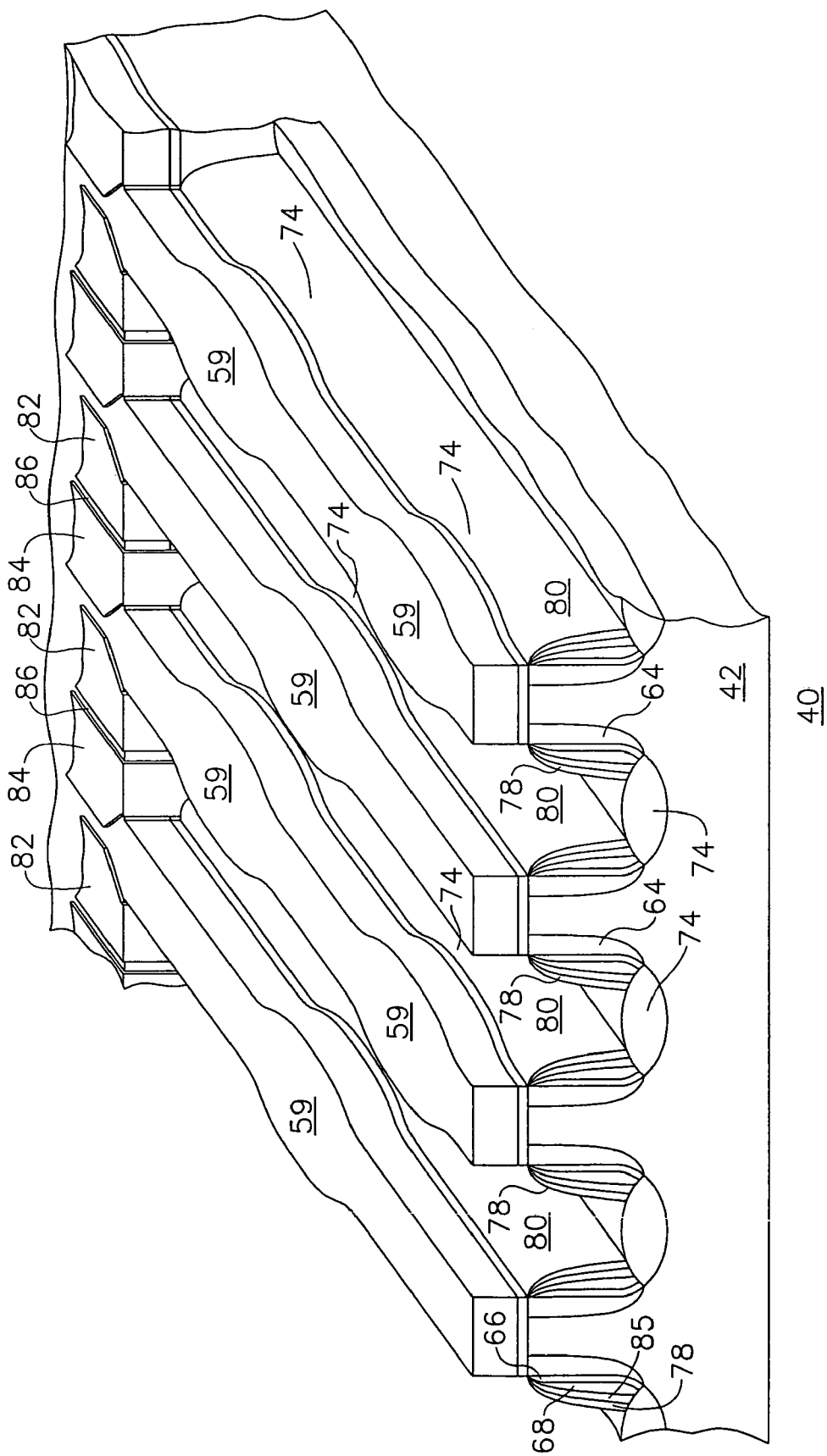

Another layer of silicon, either amorphous or polycrystalline but hereinafter referred to as poly silicon, is deposited to a thickness of about 200 nm. The poly silicon layer is doped N-type, and preferably is deposited as a doped layer. The doping can be phosphorus or arsenic, but preferably is phosphors. A layer of photoresist (not illustrated) is applied over the layer of poly silicon and is patterned as an etch mask for the layer of poly silicon. The poly silicon layer is etched using the patterned photoresist layer as an etch mask to form top contact or control gate 78 for memory transistors formed on wall 54 of trench 52 and top contact or control gate 80 for memory transistors formed on wall 56 of trench 52. The patterned photoresist layer also protects a contact area 82 coupled to control gate 78 and a contact area 84 coupled to control gate 80, with both contact area 82 and 84 located on the surface of nitride layer 48. The etching of the poly silicon layer, which can be done as an anisotropic etch such as a RIE, leaves the poly silicon on the sidewall of trench 52, but removes the poly silicon from all horizontal surfaces (except for contact areas 82 and 84) including the bottom of the trench and horizontal surfaces in both the core and peripheral areas. The patterned photoresist layer is removed and a further photoresist layer (again not illustrated) is applied and patterned. This further photoresist layer is patterned to protect all of the poly silicon except the poly silicon on the wall at the ends of the trenches. Using the patterned photoresist as an etch mask, the exposed poly silicon is etched to form a gap 86 at the end of each trench physically and electrically separating poly silicon control gate 78 from poly silicon control gate 80. FIG. 8 illustrates, in a partially cut away perspective view, a portion of integrated circuit 40 at this stage of the processing. The poly silicon forming control gates 78 and 80 extends along the length of trench 52 on the walls of the trench, and at the end of the trench extends up and onto the horizontal surface of nitride layer 48 to form contacts 82 and 84. In this and later figures, for ease of illustration, the three ONO layers are illustrated by a single layer 85.

Having completed a much of the core area of IC 40, the process now continues by processing a portion of the peripheral area. Again, as these process steps are conventional, they need not be described or illustrated in detail. A layer of oxide 90 is deposited over the entire structure, in part to protect the core area from subsequent process steps to be performed in the peripheral area. The layer of oxide is photolithographically patterned to remove the oxide from the peripheral area while leaving the oxide covering and masking the core area. Using the patterned oxide as an etch mask, silicon nitride layer 48 is removed from the peripheral area. Until now, the silicon nitride layer has been masking the peripheral area from many of the process steps performed in the core area. After removing the silicon nitride layer, N-wells and P-wells are formed in the peripheral area in conventional manner to form the necessary substrate regions for the fabrication of CMOS peripheral transistors. Any remaining oxide is removed from the peripheral area, the surface of the peripheral area is cleaned, and a gate oxide layer is grown. The gate oxide layer, preferably having a thickness of 3-6 nm, will form the gate insulator of both the PMOS and the NMOS transistors of the peripheral circuitry. A layer of polycrystalline silicon having a thickness of about 150-200 nm is deposited overlying the layer of gate insulator. The layer of polycrystalline silicon is preferably deposited as an undoped polycrystalline layer and is subsequently doped with conductivity determining impurities during the formation of source and drain regions. The layer of polycrystalline silicon is patterned to form the gate electrodes of both the PMOS and the NMOS transistors of the peripheral circuitry. The portion of this polycrystalline silicon layer overlying the core area is etched and totally removed, either as part of the gate electrode forming etch step or in a separate etch step. The core area is protected by photoresist and source and drain extensions are ion implanted for first the PMOS transistors and then for the NMOS transistors of the periphery circuitry.

Figure 9:
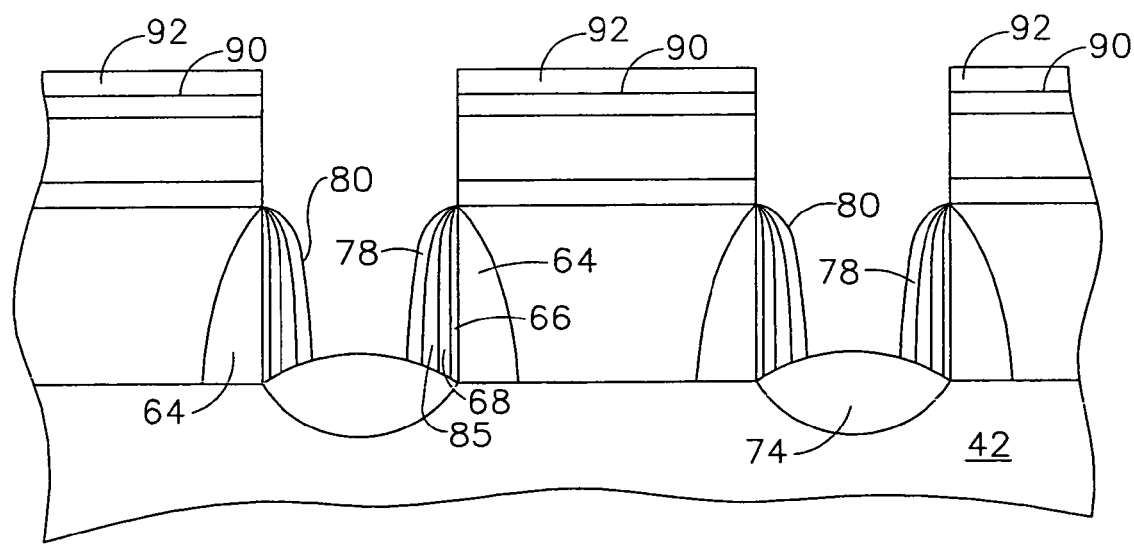

A layer of silicon nitride 92 is deposited to a thickness of about 90 nm. A layer of photoresist (not illustrated) is applied over the layer of silicon nitride and is photolithographically patterned to leave the photoresist covering all of the peripheral area and overlying the substrate between the trenches in the core area. Using the patterned photoresist as an etch mask, layer of silicon nitride 92 and layer of oxide 90 are etched to remove the nitride and oxide from the patterned poly silicon 78 and 80 and to leave the nitride and oxide overlying the substrate between the trenches as illustrated in FIG. 9.

Figure 10:
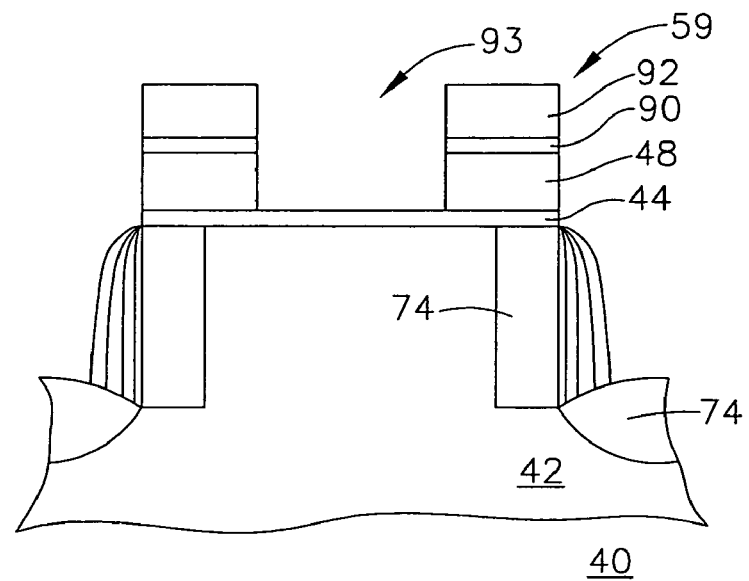
Figure 11:
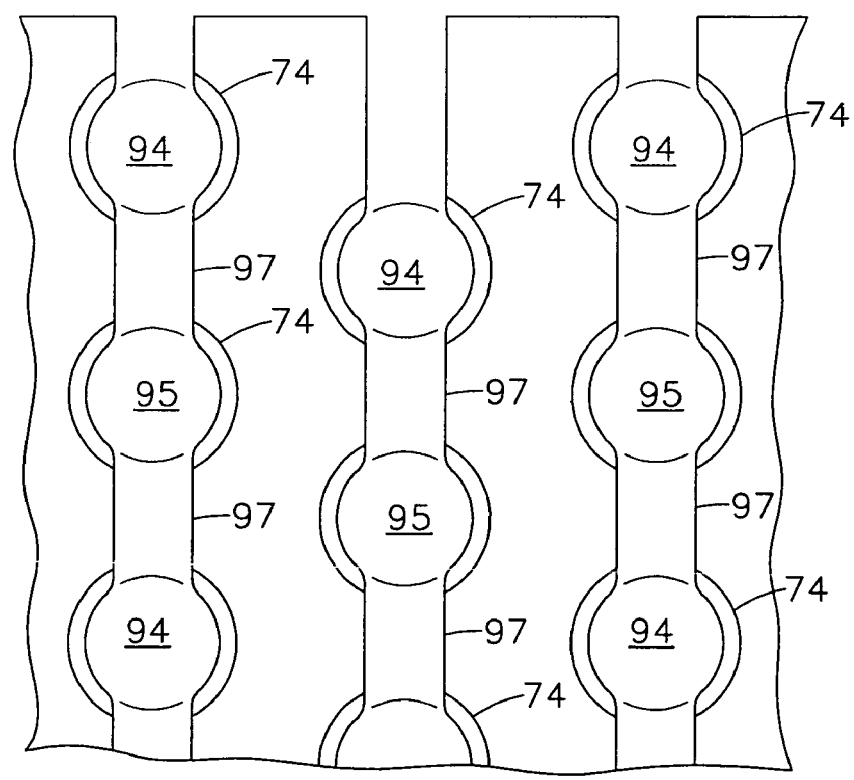

The layer of patterned photoresist is removed and another layer of photoresist (not illustrated) is applied and patterned. The layer of patterned photoresist covers the peripheral area and all of the core area except for a portion of each of contact regions 59. The patterned photoresist is used as an etch mask and layer of nitride 92, layer of oxide 90 and layer of nitride 48 exposed in the contact regions are etched to form an opening 93 as illustrated in cross section in FIG. 10 to allow a subsequent ion implantation into the contact regions. FIG. 10 illustrates a cross section through only one of contact regions 59. Recall that the contact areas are also the regions along the length of the trench in which isolating oxide 74 was grown.

Figure 12:
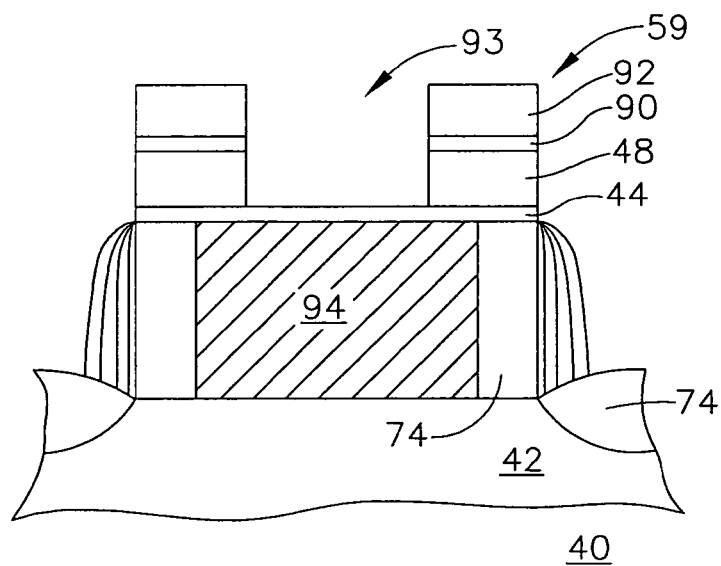

The layer of patterned photoresist is removed and another layer of photoresist (not illustrated) is applied and patterned to leave the photoresist covering and protecting all of the core area. With the core area protected, nitride layer 92 is anisotropically etched to form spacers on the sidewalls of the gate electrodes in the peripheral area. After forming the spacers, the PMOS transistors are masked with photoresist and N-type ions are implanted to form the source and drain regions of the NMOS transistors in the peripheral area. The N-type ions are also implanted into the exposed portions of contact regions 59 in the core area to form drain regions 94 and source regions 95 alternating in the substrate along the length of trench 52 as illustrated in top view in FIG. 11. Channels 97 of the MOS transistors exist along the walls of the trench between the source and drain regions. In operation, current flows through the channel between the source and drain regions in a direction along the length of the trench. Isolation oxide 74 separates each channel from adjacent channels. The NMOS transistors and the core area are then masked with photoresist and P-type ions are implanted to form the source and drain regions of the PMOS transistors in the peripheral area. Following the implantations, the patterned photoresist is patterned and the implants are annealed, for example by RTA. Drain regions 94 and source regions 95, formed in the substrate bounding trenches 52, extend from the surface of the substrate to the bottom of the trench as illustrated in FIG. 12 which shows an exemplary drain region in cross section.

Any residual oxide is removed from the implanted regions including the gate electrodes and also from the poly silicon forming control gates 78 and 80 and contact area 82 and 84, for example by etching in dilute hydrofluoric acid. A silicide forming metal such as cobalt is blanket deposited and heated, for example by RTA, to form a metal silicide (not illustrated) in those locations where the metal is in contact with silicon. The metal silicide forms on the source regions, drain regions, and gate electrodes of the peripheral transistors and on the contact regions 59 forming contacts to source and drain regions 94 and 95, control gates 78 and 80 and contact areas 82 and 84 in the core area. The silicide forming metal that is not in contact with exposed silicon does not react during the RTA and can be removed, for example by washing in a $H_2O_2$/$H_2SO_4$ or $HNO_3$/HCl solution. After silicidation a layer of oxide is blanket deposited to a thickness great enough to fill trenches 52. The excess oxide can be removed and the upper surface of the oxide layer is planarized, for example by CMP. Contact openings are etched through the planarized oxide to expose the surface of drain regions 94, source regions 95, and contact areas 82 and 84. Contact openings are also formed in the peripheral area to allow electrical contact to source and drain regions and to gate electrodes as necessary for the circuit function being implemented.

Figure 13:
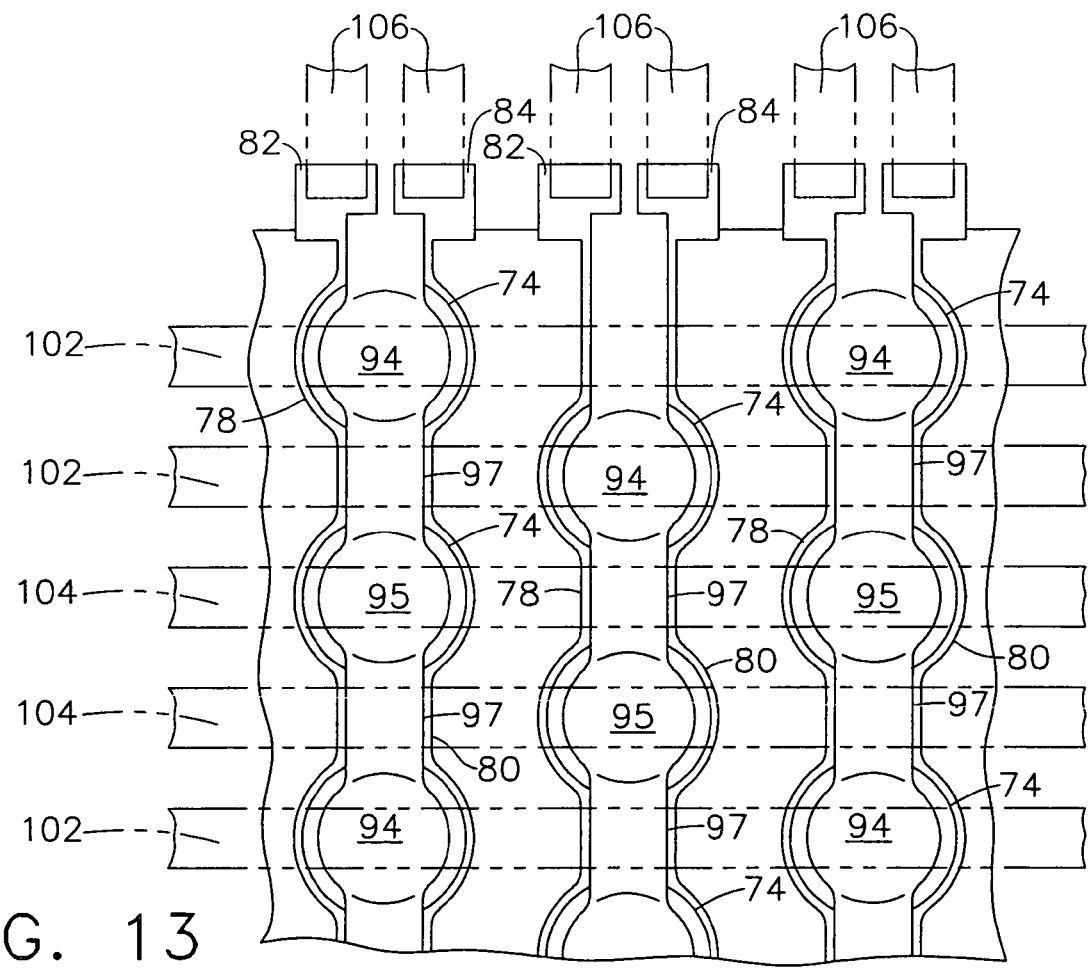

As illustrated in top view in FIG. 13, a layer of metal is deposited on the surface of the planarized oxide layer and is patterned to form bit lines 102, source lines 104, and word line contacts 106. Bit lines 102 electrically contact drain regions 94, source lines electrically contact source lines 95, and word line contacts 106 electrically contact control gates 78 and 80. The metal lines can be aluminum, copper, alloys of those metals, or other conductive materials commonly used for interconnection on a semiconductor integrated circuit. Although not illustrated, plug structure may be used to directly contact the metal silicide and fill the contact openings. The plug structure may include, for example, sequential layers of titanium, titanium nitride, and tungsten as is well known. The metal lines would then electrically contact the plug structure. Although the bit lines, source lines, and word lines are all illustrated to be on a single level, it may be advantageous, for optimum layout reasons, to form the bit lines and source lines in one layer of metal and to form the word lines in another layer of metal separated from the bit lines by a layer of inter level dielectric.

Integrated circuit 40 can be completed with the conventional back end of line processing which, being conventional, will not be described herein.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor memory device comprising:
a semiconductor substrate having a surface;
a trench etched into the body of the substrate extending away from the surface and having a first wall and a second wall extending into the body of the substrate and having a bottom at the extremity of the first wall and the second wall within the semiconductor substrate;
a first drain region and a second drain region formed in the semiconductor substrate along the first wall and a third drain region and a fourth drain region formed in the semiconductor substrate along the second wall, each drain region extending from proximate the surface toward the bottom wherein the first, second, third and forth drain regions are formed along the first and second walls in the length direction of the trench;
a first source region formed in the semiconductor substrate along the first wall between and spaced apart from the first drain region and the second drain region and a second source region formed in the semiconductor substrate along the second wall between and spaced apart from the third drain region and the fourth drain region, each source region extending from proximate the surface toward the bottom;
a first channel region formed in the semiconductor substrate along the first wall between the first drain and the first source, a second channel region formed in the semiconductor substrate along the first wall between the first source and the second drain, a third channel region formed in the semiconductor substrate along the second wall between the third drain region and the second source, and a fourth channel region formed in the semiconductor substrate along the second wall between the second source region and the fourth drain;
a first gate electrode overlying the first channel, a second gate electrode overlying the second channel, a third gate electrode overlying the third channel, and a fourth gate electrode overlying the fourth channel;
a first word line coupled to the first gate electrode and the second gate electrode and a second word line coupled to the third gate electrode and the fourth gate electrode;
a first bit line coupled to the first drain region and the third drain region and a second bit line coupled to the second drain region and the fourth drain region;
a first isolation oxide grown at the bottom of the trench; and
a second isolation oxide grown on the first wall between the first channel and the second channel and a third isolation oxide grown on the second wall between the third channel and the fourth channel.

2. The semiconductor memory device of claim 1 further comprising a first P-type well region formed in the semiconductor substrate along the first wall and a second P-type well region formed in the semiconductor substrate along the second wall.

3. The semiconductor memory device of claim 1 further comprising a tunnel oxide overlying the first channel, the second channel, the third channel, and the fourth channel.

4. The semiconductor memory of claim 1 wherein the second isolation oxide overlies the first source region and the third isolation oxide overlies the second source region.

5. The semiconductor memory of claim 1 further comprising contacts to the first drain region, the second drain region, the third drain region, the fourth drain region, the first source region, and the second source region all formed on the surface of the semiconductor substrate.

6. The semiconductor memory of claim 3 further comprising a silicon layer overlying the tunnel oxide.

7. The semiconductor memory of claim 6 further comprising a second layer of oxide overlying the silicon layer, a layer of silicon nitride overlying the second layer of oxide, and a third layer of oxide overlying the layer of silicon nitride.

8. A semiconductor device comprising:
   a semiconductor substrate having a surface;
   a trench formed in the body of the semiconductor substrate and bounded by a trench wall extending from the surface to a bottom;
   a drain region formed in the substrate along the trench wall and extending from the surface toward the bottom wherein the drain region is formed in the length direction of the trench;
   a source region formed in the substrate along the trench wall and extending from the surface toward the bottom;
   a channel region formed in the substrate along the trench wall between the drain region and the source region and extending parallel to the surface;
   a gate insulator overlying the channel; and
   a gate electrode overlying the gate insulator;
   a localized oxide grown at the bottom; and
   a first localized oxide grown on the substrate along the trench wall on a first side of the channel and a second localized oxide grown on the substrate along the trench wall on a second side of the channel.

9. The semiconductor device of claim 8 further comprising a drain contact formed at the surface and electrically contacting the drain region; and a source contact formed at the surface and electrically contacting the source region.

10. The semiconductor device of claim 8 wherein the first localized oxide overlies the source region and the second localized oxide overlies the drain region.

11. The semiconductor device of claim 8 wherein the gate insulator comprises a tunnel oxide and an ONO stack.

* * * * *